United States Patent [19]

Andreaggi

[11] 4,053,047
[45] Oct. 11, 1977

[54] COMBINATION DISPLAY COVER, HANDLE, AND TILT STAND FOR PORTABLE INSTRUMENT

[75] Inventor: Joseph R. Andreaggi, Short Hills, N.J.

[73] Assignee: Weston Instruments, Inc., Newark, N.J.

[21] Appl. No.: 675,674

[22] Filed: Apr. 9, 1976

[51] Int. Cl.² .................... B65D 25/24; B65D 85/38
[52] U.S. Cl. ........................... 206/45.2; 206/45.23; 206/305
[58] Field of Search ................. 206/45.2, 45.23, 305, 206/377

[56] References Cited

U.S. PATENT DOCUMENTS

| 457,598 | 8/1891 | Briggs | 206/45.23 |
|---|---|---|---|
| 1,483,289 | 2/1924 | Doering et al. | 206/45.23 |
| 2,590,307 | 3/1952 | Gibson | 206/377 |
| 2,897,034 | 7/1959 | Kalen | 206/45.23 |

*Primary Examiner*—William T. Dixson, Jr.
*Attorney, Agent, or Firm*—William R. Sherman; Kevin McMahon; Martin M. Novack

[57] ABSTRACT

A combination display window cover, tilt stand, and handle for a portable instrument, the unit serving each of these functions by virtue of an integrally formed appropriately shaped unit which can preferably be molded as a single piece of elastomeric material and does not introduce any substantial cost increase over and above a conventional handle. The invention is suited for use in conjunction with a portable instrument which includes a housing of generally parallelepiped configuration having relatively large area front and rear opposing surfaces and relatively small area top, bottom and opposing side surfaces, the housing having a display window extending across its front surface relatively near the top edge thereof and substantially parallel to the top edge. In accordance with the invention, there is provided a combination display window cover, handle, and tilt stand unit which comprises first and second generally triangular members, each pivotally mounted at about one of its corners on opposite side surfaces of the housing and relatively near the top surface of the housing. A generally rectangular panel joins the edges of the triangular members which are opposite the said one corners of the triangular members. The triangular members are proportioned such that when the unit is pivoted to its limit over the front surface the panel overlays the display window and when the unit is pivoted to a position over the rear surface, one edge of the panel is spaced from the rear surface whereby the instrument can be seated on a working surface at a stable tilt position resting on its rear bottom edge and said one edge of the panel.

12 Claims, 4 Drawing Figures

COMBINATION DISPLAY COVER, HANDLE, AND TILT STAND FOR PORTABLE INSTRUMENT

BACKGROUND OF THE INVENTION

This invention relates to portable instruments and, more particularly, to a combination display cover, handle, and tilt stand, for a portable instrument.

Portable instruments, such as digital multimeters, are presently in widespread use. Typically, these instruments have the display window on their front face, generally a piece of rectangular glass or plastic which covers an electronically activated display media. The glass or plastic cover is susceptible to scratching or breakage, especially when the instrument is stored in a tool box. However, covering means are generally not provided for since their use involves some inconvenience and, also, they add to the basic cost of the instrument. Thus, there is a need for an instrument window cover which does not involve significant additional cost and does not result in even minor inconvenience of use.

There is also a need for an instrument tilt stand which allows the instrument to be placed at rest at an angle such that it is in a relatively stable position while still presenting the display at a slight angle which facilitates reading of the display. Provision for a collapsible tilt stand involves additional expense and inconvenience of use. Also, if a conventional swivel handle is used as a tilt stand, it is generally found that the resultant tilt angle is either not sufficient for an optimized reading angle or is unduly severe and introduces instability. Thus, there is also a need for an improved tilt stand which, again, does not add either substantial expense or inconvenience to the portable instrument.

It is an object of this invention to provide solutions to the prior art problems as set forth.

SUMMARY OF THE INVENTION

The present invention is directed to a combination display window cover, tilt stand, and handle for a portable instrument, the unit serving each of these functions by virtue of an integrally formed appropriately shaped unit which can preferably be molded as a single piece of elastomeric material and does not introduce any substantial cost increase over and above a conventional handle. The invention is suited for use in conjunction with a portable instrument which includes a housing of generally parallelpiped configuration having relatively large area front and rear opposing surfaces and relatively small area top, bottom and opposing side surfaces, the housing having a display window extending across its front surface relatively near the top edge thereof and substantially parallel to the top edge. In accordance with the invention, there is provided a combination display window cover, handle, and tilt stand unit which comprises first and second generally triangular members, each pivotally mounted at about one of its corners on opposite side surfaces of the housing and relatively near the top surface of the housing. A generally rectangular panel joins the edges of the triangular members which are opposite the said one corners of the triangular members. The triangular members are proportioned such that when the unit is pivoted to its limit over the front surface, the panel overlays the display window and when the unit is pivoted to a position over the rear surface, one edge of the panel is spaced from the rear surface whereby the instrument can be seated on a working surface at a stable tilt position resting on its rear bottom edge and said one edge of the panel.

In the preferred embodiment of the invention, each of the triangular members is proportioned such that the triangle leg which joins said one edge of the panel is substantially longer than the triangle leg which joins the edge of the panel opposite said one edge. In this embodiment, said one edge of the panel has an outwardly extending flange so as to increase the stability of the instrument when it is in the tilt stand position. Also, in this embodiment, the outer edge of the flange has longitudinal serrations thereon to enhance its non-slip characteristic.

Further features and advantages of the invention will become more readily apparent from the following detailed description when taken in conjunction with the accompanying drawings.

DESCRIPTION OF THE PREFERRED EMBODIMENT

Figure 1:
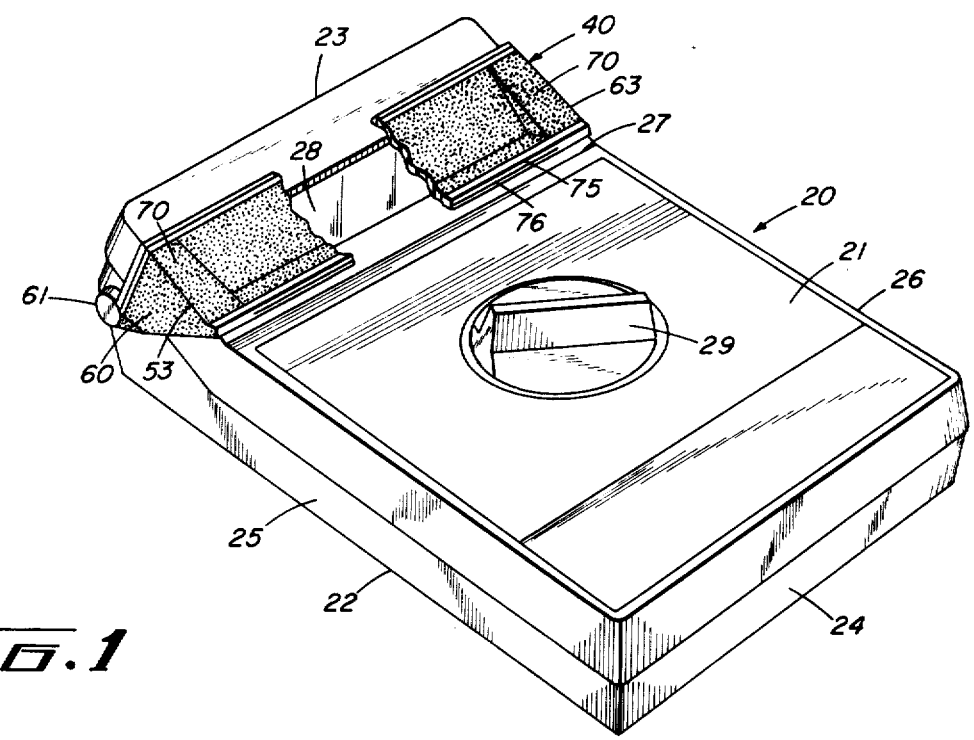
FIG. 1 is an elevational view of a portable instrument including the unit of the invention, shown partially cutaway, in the display cover position.

Referring to FIG. 1, there is shown an embodiment of the invention as utilized in conjunction with a portable instrument such as the multimeter 20. The meter 20 has a housing of generally parallelpiped configuration which has a front surface 21, a rear surface 22, a top 23, a bottom 24 and sides 25 and 26. In the illustration of FIG. 1, the housing is angularly raised from about a line 26 on the front surface thereof which is parallel to the top edge, although this is not necessary for operation of the invention to be described. A display window 28, which is typically rectangular in shape and formed of plastic or glass, extends across the front surface 21 on the angularly raised portion thereof. Beneath the display window are typically mounted suitable display means such as a digital readout. A control knob 29 is shown as being mounted on the front surface of the housing, but does not functionally relate to the invention.

Figure 2:
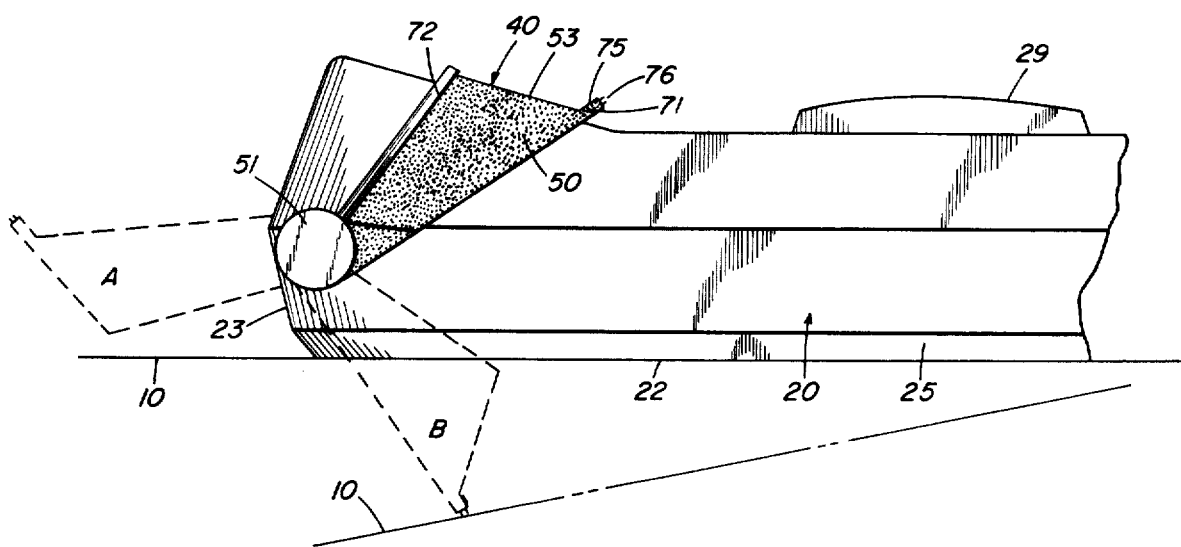
FIG. 2 is a side view of the instrument of FIG. 1, and also shows the unit of the invention in the handle position and the tilt stand position.
Figure 3:
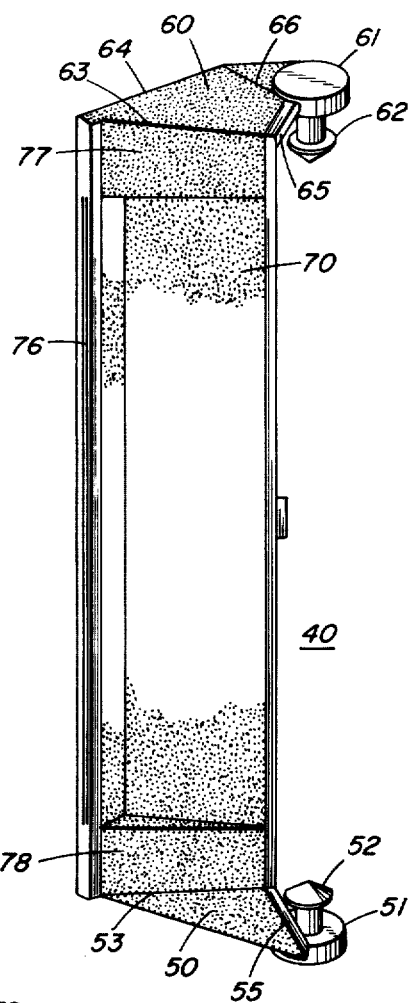
FIG. 3 is a bottom elevational perspective view of a unit in accordance with an embodiment of the invention.
Figure 4:
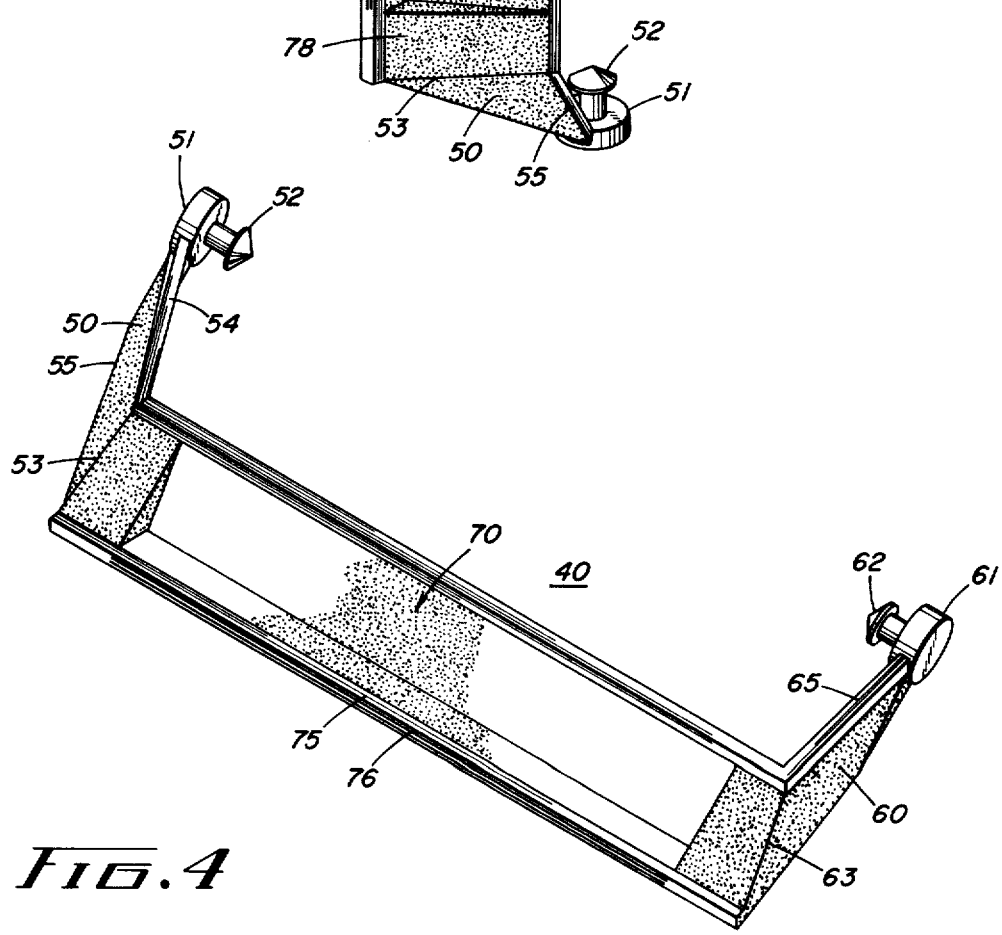
FIG. 4 is a top elevational perspective view of a unit in accordance with an embodiment of the invention.

The invention is a combination display window cover, handle, and tilt stand unit 40 and reference is additionally made to the FIGS. 2, 3 and 4 for the description thereof. Generally triangular members 50 and 60 are each pivotally mounted at about one of their corners, 51 and 61, on opposite side surfaces of the housing 20, and relatively near the top surface of the housing as seen in FIGS. 1 and 2. Mounting pins or dowels 52 and 62 are insertible in apertures (not visible) in the side surface of the housing for this purpose. In the present embodiment, the corners 51 and 61 are rounded to provide support for the mounting pins. A generally rectangular panel 70 joins the edges of the triangular members which are opposite to the corners 51 and 61; viz., the edges 53 and 63. In general, the triangular members are proportioned such that when the unit 40 is pivoted to its limit over the front surface 21 of housing 20, the panel 70 overlays and protects the display window 28, as shown in FIGS. 1 and 2. When the unit 40 is pivoted to a position over the top 23 of housing 20, the unit serves as a handle, as can be visualized from the dotted rendition A in FIG. 2. Finally, when the unit is pivoted to a position over the rear surface 22 of housing 20, one edge (71) of the panel 70 is spaced from the rear surface such that the instrument can be seated on a working surface (as represented by dashed line 10 in FIG. 2) at a stable tilt position resting on its rear bottom edge and the one edge 71 of the panel 70.

In the present embodiment, each of the triangular members 50 and 60 is proportioned such that one of the triangle legs (54 and 64) which joins the one edge 71 of the panel is substantially longer than the triangle leg (55 and 65) which joins the edge 72 of the panel opposite the one edge. Also, in the present embodiment, the edge 71 of panel 70 has an outwardly extending flange 75 so as to increase the stability of the instrument when it is in the tilt stand position. The outer edge of flange 75 preferably has longitudinal serrations 76 thereon to enhance its gripping ability.

In the preferred embodiment of the invention, each of the triangular members 50 and 60 has an angular bend therein along a line (56 and 66) extending between the legs (54 and 55, 64 and 65), the line extending from near the corner (51 and 61) of the short leg to about the center of the long leg. The bends serve as a detent which tends to hold the unit 40 in place when it is in the display window cover or tilt stand positions. Recesses 77 and 78 in the panel 70 (FIG. 3) prevent interference of the triangular members 50 and 60 with the side of the unit while allowing the panel to be contoured for an optimum fit over the display window 28.

The invention has been described with reference to a preferred embodiment, but variations within the spirit and scope of the invention will occur to those skilled in the art. For example, while it is preferred that the unit 40 be molded of an integral piece of elastomeric material, it will be understood that alternate fabrications could be implemented within the spirit and scope of the invention.

I claim:

1. For use in conjunction with a portable instrument which includes a housing of generally parallelpiped configuration having relatively large area front and rear opposing surfaces and relatively small area top, bottom and opposing side surfaces, said housing having a display window extending across said front surface relatively near the top edge thereof and substantially parallel to said top edge; a combination display window cover, handle, and tilt stand unit, comprising:

first and second generally triangular members, each pivotally mounted at about one of its corners on opposite side surfaces of said housing and relatively near the top surface of said housing; and a generally rectangular panel joining the edges of said triangular members which are opposite said one corners of said triangular members;

said triangular members being proportioned such that when said unit is pivoted to its limit over said front surface, said panel overlays said display window and when said unit is pivoted to a position over said rear surface, one edge of said panel is spaced from said rear surface whereby said instrument can be seated on a working surface at a stable tilt position resting on its rear bottom edge and said one edge of the panel.

2. The unit as defined by claim 1 wherein each of said triangular members is proportioned such that the triangle leg which joins said one edge of the panel is substantially longer than the triangle leg which joins the edge of the panel opposite said one edge.

3. The unit as defined by claim 1 wherein said one edge of the panel has an outwardly extending flange so as to increase the stability of the instrument when in the tilt stand position.

4. The unit as defined by claim 2 wherein said one edge of the panel has an outwardly extending flange so as to increase the stability of the instrument when in the tilt stand position.

5. The unit as defined by claim 3 wherein the outer edge of said flange has serrations thereon to enhance its gripping ability.

6. The unit as defined by claim 4 wherein the outer edge of said flange has serrations thereon to enhance its gripping ability.

7. The unit as defined by claim 1 wherein the unit has a pair of dowels extending inwardly from said defined one corners thereof and said housing has a pair of apertures to receive said dowels in rotatable relation.

8. The unit as defined by claim 2 wherein the unit has a pair of dowels extending inwardly from said defined one corners thereof and said housing has a pair of apertures to receive said dowels in rotatable relation.

9. The unit as defined in claim 1 wherein each of said triangular members has an angular bend therein at a line extending between the triangular legs which meet at said corner, said bend serving as a detent when said unit is in the tilt stand position.

10. The unit as defined in claim 2 wherein each of said triangular members has an angular bend therein at a line extending between the triangular legs which meet at said corner, said bend seving as a detent when said unit is in the tilt stand position.

11. The unit as defined by claim 3 wherein each of said triangular members has an angular bend therein at a line extending between the triangular legs which meet at said corner, said bend serving as a detent when said unit is in the tilt stand position.

12. The unit as defined by claim 1 wherein said housing is angularly raised from a line on the front surface thereof parallel said top edge toward said top edge so that said display window is presented at an angle.

* * * * *